United States Patent [19]

Hartmann

[11] Patent Number: 5,024,975
[45] Date of Patent: Jun. 18, 1991

[54] CRYSTALLIZABLE, LOW DIELECTRIC CONSTANT, LOW DIELECTRIC LOSS COMPOSITION

[75] Inventor: Hans S. Hartmann, Wilmington, Del.

[73] Assignee: E. I. Du Pont de Nemours and Co., Inc., Wilmington, Del.

[21] Appl. No.: 423,366

[22] Filed: Oct. 19, 1989

[51] Int. Cl.$^5$ .......................... C03C 3/89; C03C 3/91; B32B 9/00

[52] U.S. Cl. ........................................ 501/65; 501/66; 501/21; 501/32; 501/17; 428/901; 428/209; 428/433

[58] Field of Search .................. 501/65, 66, 2, 17, 32, 501/20, 21; 428/209, 210, 426, 433, 547, 901, 906, 545, 548, 650; 174/68.5

[56] References Cited

U.S. PATENT DOCUMENTS

| | | |
|---|---|---|
| 4,490,429 | 12/1984 | Tosaki et al. |
| 4,547,625 | 10/1985 | Tosaki et al. ........................ 501/16 |
| 4,654,095 | 3/1987 | Steinberg ............................. 501/17 |
| 4,655,864 | 5/1987 | Rellick ................................. 501/17 |
| 4,749,665 | 6/1988 | Yano et al. ........................... 501/65 |
| 4,752,531 | 6/1988 | Steinberg ............................. 501/15 |
| 4,849,379 | 7/1989 | McCormick ......................... 501/17 |
| 4,849,380 | 7/1989 | Sawhill ................................. 501/17 |

FOREIGN PATENT DOCUMENTS 0209895 9/1987 Japan ..................................... 501/65

*Primary Examiner*—William R. Dixon, Jr.
*Assistant Examiner*—Sue Hollenbeck

[57] ABSTRACT

A variable TCE composition for making dielectric layers having low dielectric constant and low dielectric loss, the composition comprising an admixture of finely divided solids comprising amorphous crystallizable glass, amorphous borosilicate frit, ceramic expansion control additive, and crystallization control additive. The dielectric layers are useful in circuits especially for high density and high frequency applications.

18 Claims, 3 Drawing Sheets

CRYSTALLIZABLE, LOW DIELECTRIC CONSTANT, LOW DIELECTRIC LOSS COMPOSITION

FIELD OF INVENTION

The invention relates to dielectric compositions, especially those which are useful in forming low temperature co-fired multilayer circuits.

BACKGROUND OF THE INVENTION

Multilayer thick film circuits have been used for many years to increase circuit functionality per unit of area. Recent advances in circuit technology have placed new demands on dielectric materials for this use. Heretofore, most of the dielectric materials used in multiple circuits have been conventional thick film dielectric compositions. These are comprised of finely divided particles of dielectric solids and inorganic binders dispersed in an inert organic medium. Such thick film materials are usually applied by screen printing, though they may be applied by other means as well. Thick film materials of this type are very important and will continue to be so.

In constructing a multilayer circuit using thick film materials, it is necessary to print, dry and fire sequentially each functional layer before the next layer is applied. Thus, in a typical situation involving multilayer circuits having, say, ten layers, thirty separate processing steps (printing, drying and firing each layer) are required as well as ten inspections to assure the quality of each of the processed layers. Such a complex process is, of course, expensive both because of the great number of steps and because of the high yield losses which are normally incident to such a complex procedure. Moreover, the present state of the art limits these structures to a maximum of ten layers.

Another approach to this problem has been the use of dielectric tapes, which are thin sheets of ceramic dielectric material, such as alumina. The tape process involves lamination of a number of sheets of unfired tape (usually alumina) interspersed with alternating printed layers of electrically functional material. However, very high temperatures (e.g. on the order of 1600° C.) are required to sinter the alumina. Thus, only very high melting electrically functional materials such as tungsten and molybdenum can be used. Unfortunately, molybdenum and tungsten have poor electrical and, in particular, conductivity properties which make them less satisfactory for very high speed, highly complex circuitry.

Recently, low temperature co-fired (LTCF) technology has been introduced as a method for fabricating multilayer circuits. This technology offers the combination of the processing advantages of the alumina-based tape technology plus the materials advantages of thick film technology. The LTCF tape systems have firing temperatures below 1000° C. and allow the use of highly electrically functional metals such as silver, palladium/silver, gold, platinum, nickel and copper.

One type of dielectric tape system, as disclosed in commonly assigned, copending U.S. application Ser. No. 07/423,367, filed concurrently herewith, uses amorphous crystallizable glass plus glass frit to achieve tapes with low dielectric constant (K), dimensional stability, low dielectric loss and variable thermal coefficient of expansion (TCE). However, this system suffers the disadvantage of requiring relatively long firing times in order to develop the degree of crystallinity necessary to become rigid for subsequent distortion-free refiring. Such long firing times cannot be realized in the conventional belt furnaces commonly used throughout the thick film industry. Therefore, the copending dielectric compositions require batch processing in box furnaces, which is an economic disadvantage.

In addition, in these copending compositions, the amorphous borosilicate glass (frit) tends to migrate to the surface during firing unless composition, firing time and firing temperature are carefully matched within a narrow range. Glass migration to the surface causes poor adhesion of the electrically functional metallized layer to the underlying structure which can lead to undesirable electrical shorts when portions of the metallized layer fall off the dielectric layer. It is difficult to tailor the compositions of the copending application to a particular TCE and minimal firing temperature without glass migration.

Thus, there is a need for improved dielectric compositions which can reliably produce fired parts with predetermined electrical properties. There is also a need for dielectric compositions for which the required firing time is short enough to allow for processing in conventional belt furnaces. And there is a need for dielectric compositions which have variable TCE's such that the TCE can be controlled to match the TCE of other materials such as silicon, gallium arsenide and alumina.

SUMMARY OF THE INVENTION

In its primary aspect, the invention is directed to a composition for making low dielectric loss, low K dielectric layers comprising an admixture of finely divided solids comprising:

(a) 20-80% by weight, basis total solids, amorphous crystallizable glass;

(b) 20-60% by weight, basis total solids, amorphous borosilicate glass (1) in which the weight ratio of $B_2O_3$ to $SiO_2$ is 0.22-0.55, and (2) containing, basis total borosilicate glass, 0.2-1.0% by weight $Al_2O_3$, and 1.5-4.0% by weight of a mixture of oxides of alkali metals, alkaline earth metals or mixtures thereof, at least 0.5-1.2% by weight being $Li_2O$;

(c) 0.1 to 30% by weight, basis total solids, expansion control additive; and (d) 0.05 to less than 1.0% by weight, basis total solids, crystallization control additive.

In a second aspect, the invention is directed to a tape casting composition comprising the above-described dielectric composition dispersed in a binder/plasticizer matrix in a volatile nonaqueous solvent.

In a third aspect, the invention is directed to an unfired tape formed by casting a thin layer of the above described dispersion onto a flexible substrate, such as a stainless steel belt or polymeric film, and heating the cast layer to remove the volatile solvent therefrom.

In a fourth aspect, the invention is directed towards an assemblage comprising at least one electrically functional layer and at least one fired layer of the above described tape, the tape layer having been fired to volatilize the organic material, densify the solids, and crystallize the crystallizable portion of the composition.

DETAILED DESCRIPTION OF THE INVENTION

A. Amorphous Crystallizable Glass

Figure 1:
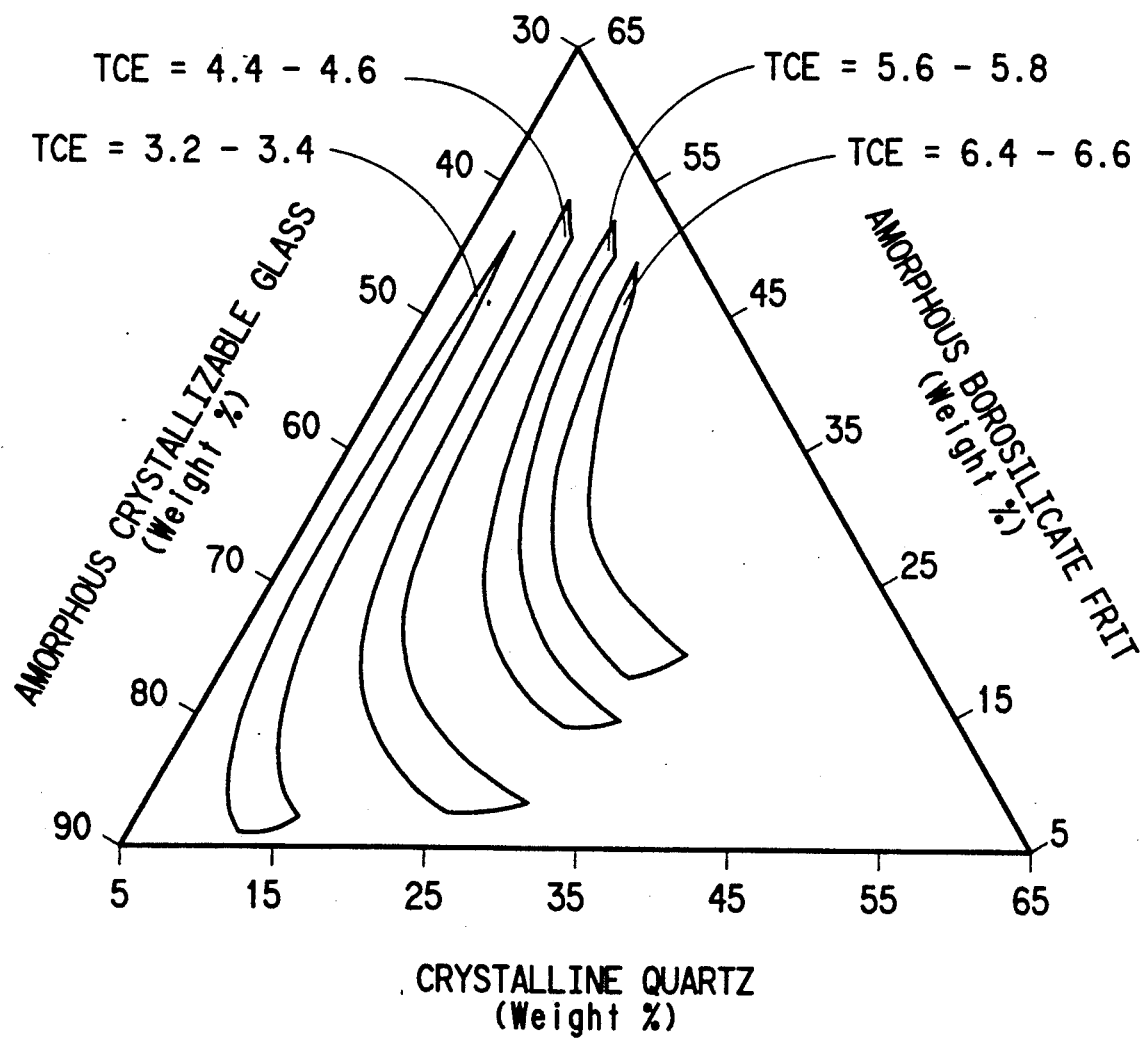
FIG. 1 is a graph of thermal coefficient of expansion, TCE, as a function of composition for an amorphous crystallizable cordierite glass-amorphous borosilicate glass-crystalline quartz-polycrystalline cordierite system.

In order to achieve dimensional stability of the composition during processing and particularly after the first firing step, it is important that the composition include an amorphous crystallizable glass. Any amorphous glass that crystallizes upon firing and does not substantially react with the borosilicate glass component of the invention may be used as the amorphous crystallizable glass. The precise composition of the amorphous crystallizable glass will depend upon the desired properties of the part made from the composition. To produce a multilayer substrate with low K and low loss tangent, one would use an amorphous glass composition that develops, in the crystallization process, a crystalline phase that has these properties. Examples of such amorphous crystallizable glasses include compositions that, in the phase diagram, lie in the primary crystallization field of phases having properties such as low K and low loss tangent. Specific examples include compositions of MgO, $Al_2O_3$ and $SiO_2$ in ratios that lie in the field of alpha cordierite (Indialite) and $CaO-Al_2O_3-SiO_2$ compositions in the anorthite field. The compositions of such crystalline phases are known in the art. For example, in *Phase Diagrams for Ceramists*, Levin et al., American Ceramists Society, Columbus, Ohio, (1964), FIG. 712 on page 246 shows the crystalline phases for $MgO-Al_2O_3-SiO_2$ systems and FIG. 631 on page 220 shows the crystalline phases for $CaO-Al_2O_3-SiO_2$ systems.

The amorphous crystallizable glass should be present in an amount from 20–80% by weight based on total inorganic solids, and preferably from 25–60% by weight. If less than about 20% by weight is used, there is not sufficient crystallinity to achieve dimensional stability through multiple firings. If more than about 80% by weight is used the TCE of the fired material will be too low to be compatible with silicon based semiconductors. Preferably, the TCE (25°–300° C.) of the fired material is in the range of 3.0 to 6.5 in order to match or complement the TCE of materials which contact the fired material in an end product. Such materials include silicon and gallium arsenide which are common in active devices, and alumina, aluminum nitride and beryllia which are common substrates in chip carriers. In addition to the amount of amorphous crystallizable glass, the TCE of the fired material is also affected by the level of glass frit and expansion control additive present in the composition. Therefore, the amounts of these two components should also be chosen to achieve the desired TCE of the fired material as is discussed below.

The amorphous cyrstallizable glass is usually present as finely divided particles. These particles can be prepared by conventional glass making techniques such as mixing the components of the glass in the desired proportions, heating the mixture to form a homogeneous melt, then dry quenching the melt through cooled rollers, and grinding the resultant flakes into finely divided particles. The size of the particles is limited by the desired surface smoothness of the finished part and the available processing time for the dielectric composition. The available processing time is a limitation because these amorphous crystallizable glasses, when quenched and ground into finely divided particles, are found to be surface nucleated. Hence, the size of the particles effects the time needed for crystallization. The larger the particle, the more time needed for the crystals to grow sufficiently from the surface throughout the particle. Therefore, the particles should be small enough to sufficiently crystallize during commercially viable firing schedules. Generally, none of the particles should exceed 15 microns in size and preferably 90% of the particles in the distribution should not exceed 10 microns. It is preferred that the 50% point on the particle size distribution curve by not less than 1 micron and preferably in the range of 2–5 microns.

B. Crystallization Control Additive (CCA)

In crystallization, pervasive rigid networks of submicron crystallites are formed and this drastically reduces the overall fluidity of the material. However, the proper sequence of events must take place during the firing process. The combination of glasses must remain inert while all of the organic binder is being burned off. If sintering occurs during this phase, binder is trapped in the part, which prevents sintering to full density, and dielectric properties are adversely affected. After binder removal is completed (usually at about 500° C.), the glass is allowed to sinter, and finally it should crystallize. If crystallization occurs before sintering is complete, the part cannot sinter to full density and it remains porous. Such a part is mechanically weak and not hermetic, which is an important feature for ceramic packaging. After sintering is complete, it is important that the amorphous crystallizable glass crystallize rapidly in order for the viscosity of the system to increase such that the remaining amorphous borosilicate glass frit does not have enough mobility to migrate to the surface and adversely affect the reliability and other performance characteristics of electrically functioning materials deposited thereon.

To effect rapid crystallization, small amounts of internal nucleating agents such as $TiO_2$, $ZrO_2$, $CrO_2$, or $WoO_2$, are usually added to a glass composition before it is heated to form a homogeneous melt. Upon heating, the dispersed nucleating agents are incorporated into the melt and provide nucleation sites within the glass.

These conventional nucleating agents are unsuitable for the amorphous crystallizable glass of the invention which is quenched and ground before it is crystallized. Unreasonably high levels of more than one or two percent of the internal nucleating agents must be added to effectively increase the rate of crystallization. Such high levels of these agents adversely affect the properties of the glass. For example, at these levels, $TiO_2$, $CrO_2$, and $WoO_2$ render the glass susceptible to discoloration in reducing atmospheres and all of them, including $ZrO_2$, undesirably raise at least the dielectric constant.

The process of quenching and grinding the amorphous crystallizable glass in this invention provides surface nucleation sites on the resultant finely divided particles. I have found that the temperature at which crystallization begins and the rate of crystallization of these particles can be controlled, surprisingly, through the addition of crystallization control additives (CCA's) to the ground particles. Especially effective CCA's are finely divided polycrystalline particles of the same crystal species as is generic to the crystallizable glass, i.e. additions of powdered polycrystalline indialite (alpha-cordierite) for the crystallizable glass compositions that lie in the primary field of cordierite ($2MgO.2Al_2O_3.5SiO_2$), and polycrystalline powdered anorthite for glass compositions in the anorthite ($CaO.Al_2O_3.2SiO_2$) field. These "like" materials are particularly advantageous because they do not affect the desirable electrical or atmospheric properties of the base compositions, in contrast to the commonly used "internal" nucleation agents which do, as discussed above.

To lower the temperature at which crystallization begins and increase the rate of crystallization such that the amorphous borosilicate glass does not migrate to the surface, the CCA should be present in an amount of about 0.05 to less than 1.0% by weight, based on total solids, and preferably 0.1 to 0.5% by weight. In dielectric tapes made with 1.0% by weight or greater CCA, crystallization occurs before sintering to full density is complete. This results in very porous tapes which are mechanically weak and not hermetic.

The crystallization control additive should be present as finely divided particles. None of the particles should exceed 15 microns in size and preferably they should not exceed 10 microns. It is preferred that the 50% point on the particle size distribution curve be not less than 1 micron and preferably in the range of 2-5 microns.

C. Amorphous Borosilicate Glass

The amorphous borosilicate glass compositions which can be used in the invention contain 0.2-1.0% by weight alumina and 1.5-4.0% by weight alkali metal oxides and/or alkaline earth metal oxides. The borosilicate component of the glass must be within the range of 94.5-98.3% by weight of the glass. If less than 94.5% by weight borosilicate is used, the dissipation factor (DF) becomes too high. On the other hand, if the borosilicate content is higher than 98.3% by weight, the sintering temperature of the glass exceeds practical firing temperatures. The weight ratio of $B_2O_3$ to $SiO_2$ should be within the range of 0.22 to 0.55 and preferably 0.25 to 0.40. It is preferred that the glass be capable of viscous phase sintering at 850°-950° C. A particularly preferred borosilicate glass composition contains, by weight, 71.5% $SiO_2$, 25.5% $B_2O_3$, 0.25% $Al_2O_3$, 1% $K_2O$, 1% $Li_2O$, and the remainder 0.1% of zirconia and trace impurities of alkaline earth and alkali oxides.

It is required to have from 1.5 to 4.0% by weight oxides of alkali and/or alkaline earth metals or mixtures thereof which contain 0.5 to 1.2% by weight $Li_2O$. At least 1.5% by weight of such metal oxides are needed to obtain the proper low viscosity of the glass during firing. However, if more than 4.0% by weight is used, the dielectric losses of the sintered composition is likely to be too high. In order to minimize the amount of alkaline ions in the glass, it is preferred that the glass contain 0.3-1.2% by weight $Li_2O$ by which the lowest useful sintering viscosity can be obtained with the least amount of alkaline ions, i.e., alkali metal and alkaline metal earth ions. In addition, the amount of other alkali metal oxides, such as $Na_2O$ or $K_2O$, should be kept below 3.0% by weight.

The borosilicate glass should be present in the amount of 10-60% by weight, basis total solids, and preferably 30-50% by weight, depending on the dielectric constant and TCE-match desired. The strength of the fired layers decreases as the borosilicate glass concentration increases. Above about 60% by weight borosilicate glass, the structure tends to become too brittle and the properties of the associated conductive layers also tend to degrade. On the other hand, if the amount of borosilicate glass is less than 10% by weight, the fired structure is not sufficiently densified and is too porous.

The amorphous borosilicate glass should be present as finely divided particles. The particle size, although not critical, is generally less than 25 microns. The preferred particle size is 4 to 6 microns at the 50% point on the distribution curve.

The borosilicate glass can be prepared by conventional glassmaking techniques by mixing the desired components in the desired proportions and heating the mixture to form a homogeneous melt. The glass is then dry quenched through cooled rollers, and the resultant flakes dry milled into finely divided particles or frit, as is well known in the art.

D. Expansion Control Additive (ECA)

An expansion control additive may be added to the compositions of the invention in order to adjust the TCE. This may be done in order to match or complement the TCE of the dielectric material with that of active devices or components, or chip carriers or other substrates, such as alumina, aluminum nitride or beryllia, upon which the dielectric material may be mounted to improve thermal conductivity and/or strength. Since the TCE of the amorphous borosilicate glass and of the crystallizable glass in its crystallized form is low, the expansion control additive should have a relatively high TCE in order to raise the overall TCE of the composition. Therefore, compounds having a high TCE, low dielectric constant and low dissipation factor may be used as the expansion control additive. Preferred ECA's are selected from the group consisting of quartz, stabilized cristobalite, aluminum phosphate, and mixtures thereof.

The ECA may be present in an amount up to 30% by weight based on total inorganic solids. Preferably, it is present in an amount from 5-25% by weight, depending on the desired TCE of the system. As the amount of ECA is increased, it acts as an inert filler and raises the effective viscosity of the system, which in turn reduces the sinterability of the system. In order to accommodate increased amounts of expansion control additive, the amount of amorphous borosilicate frit may be increased to produce a composition which sinters almost completely (e.g., a composition that is sinterable to 95% of theoretical density or better). This can be accomplished by adding expansion control additive and amorphous borosilicate frit in the ratio of about 1 to 2 by weight.

The ECA should be present as finely divided particles. None of the particles should exceed 15 microns in size and preferably they should not exceed 10 microns. It is preferred that the 50% point on the particle size distribution curve be not less than 1 micron and preferably in the range of 2-5 microns.

E. Organic Medium

The organic medium in which the inorganic solids (i.e., crystallizable glass, borosilicate frit, expansion control additive and crystallization control additive) are dispersed is comprised of a polymeric binder/plasticizer matrix which is dissolved in a volatile organic solvent and, optionally, other dissolved materials such as release agents, dispersing agents, stripping agents, antifouling agents and wetting agents.

To obtain better binding efficiency, it is preferred that the weight ratio of inorganic solids to polymer be at least 4:1 and no greater than 18:1. Within these limits, it is desirable to use the least possible amount of binder in order to reduce the amount of organics which must be removed by pyrolysis and to obtain better particle packing which gives reduced shrinkage upon firing.

In the past, various polymeric materials have been employed as the binder for unfired tapes, e.g., poly(vinyl butyral), poly(vinyl acetate), poly(vinyl alcohol), cellulosic polymers such as methyl cellulose, ethyl cellulose, hydroxyethyl cellulose, methylhdyroxyethyl cellulose, atactic polypropylene, polyethylene, silicon polymers such as poly(methyl siloxane), poly(methylphenyl siloxane), polystyrene, butadiene/styrene copolymer, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates), and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

A preferred class of polymeric binders for making unfired tapes for the composition of the invention are those disclosed in Usala, in U.S. Pat. No. 4,613,648. These polymeric binders are a mixture of compatible multipolymers of 0–100% by weight $C_{1-8}$ alkyl methacrylate, 100–0% by weight $C_{1-8}$ alkyl acrylate and 0–5% by weight ethylenically unsaturated carboxylic acid or amine, the multipolymer being further characterized as having a number average molecular weight ($M_n$) of 50,000 to 100,000, a weight average molecular weight ($M_w$) of 150,000 to 350,000, the ratio of $M_w$ to $M_n$ being no greater than 5.5, the total amount of unsaturated carboxylic acid or amine in the multipolymer mixture is 0.2–2.0% by weight, and the glass transition temperature ($T_g$) of the polymer and plasticizer therein, if any, is $-30°$ to $+45°$ C.

In addition to the polymeric binder, the organic medium also contains a small amount, relative to the binder polymer, of a plasticizer which serves to lower the $T_g$ of the polymeric binder. The choice of plasticizers is, of course, determined primarily by the binder chosen. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthlate or dioctyl phthalate is most frequently used in acrylic polymer systems because it can be used effectively in relatively small concentrations.

For casting solutions, the solvent component of the organic medium is chosen so as to obtain complete solution therein of the binder/plasticizer matrix and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methyl ethyl ketone, 1,1,1-trichloroethane, tetrachloroethylene, amyl acetate, 2,2,4-triethylpentanediol-1,3-monoisobutyrate, toluene, methylene chloride, 2-propanol and trichlorotrifluoroethane.

F. Application

The dielectric tape made from the foregoing composition is used primarily as a dielectric or insulating material for multilayer electronic circuits. A roll of unfired tape can be blanked with registration holes in each corner to a size somewhat larger than the actual dimensions of the circuit. To connect various layers of the multilayer circuit, via holes can be formed in the unfired tape. This is typically done by mechanical punching. However, a sharply focused laser can be used to volatilize the unfired tape. Typical via hole sizes range from 0.006 to 0.25 inch. The interconnections between layers can be formed by filling the via holes with a thick film conductive paste. This paste is usually applied by standard screen printing techniques. Each layer of circuitry is completed by screen printing an electrically functional pattern. For example, conductor, resistor or high dielectric capacitor pastes can be printed on each layer to form conductive, resistive or capacitive circuit elements, respectively. Also, specially formulated high dielectric constant tapes similar to those used in the multilayer capacitor industry can be incorporated as part of the multilayer circuitry.

After each layer of the circuit is completed, the individual layers can be stacked and laminated. A pressing die is used to insure precise alignment between layers. The laminates are trimmed, usually with a hot stage cutter. Firing can then be carried out in a standard thick film conveyor belt furnace. Unlike many such dielectric compositions, those of the invention may be fired in oxidizing atmospheres such as air, in non-oxidizing atmospheres such as nitrogen, or in reducing atmospheres such as forming gas or $CO/CO_2$. The choice of firing atmosphere will usually be dictated by the oxidation stability of the conductive metal under firing conditions. When copper is used as the conductive metal it is necessary to use atmospheres which are slightly reducing in nature. A suitable atmosphere of CO and $CO_2$ with water vapor is described in allowed, copending application Ser. No. 07/235,273, filed Sept. 23, 1988, by McEwen et al. Another suitable atmosphere comprises hydrogen and nitrogen.

EXAMPLES

Dielectric compositions were formulated by admixing finely divided amorphous crystallizable glass particles, finely divided amorphous borosilicate glass particles, an expansion control additive and a crystallization control additive as specified hereinbelow. The glass particles were made by mixing appropriate amounts of the glass components, heating the mixture to form a homogeneous melt, dry quenching the resultant glass through cooled rollers, and then milling the glass flakes into finely divided particles.

Casting solutions were formulated by dispersing the dielectric composition in a binder/plasticizer matrix in a volatile non-aqueous solvent in the ball mill. An acrylic binder/plasticizer matrix of the type disclosed by Usala in U.S. Pat. No. 4,613,648 was used. Specifically, the binder comprised 30% by weight terpolymer of 62.3% by weight ethyl methacrylate, 37.1% by weight methyl methacrylate; 50% by weight, 1,1,1-trichloroethane; and 20% by weight methyl ethyl ketone. Dioctyl phthalate was the plasticizer and the binder/plasticizer materix comprised binder to plasticizer in a weight ratio range of about 4.5 to 5. The solvent contained the following components in the following amounts by weight:

1,1,1-Trichloroethane 70–85%
Methylene Chloride 2–7%
Methyl Ethyl Ketone 4–11%
Isopropanol 2–6%
1,1,2-Trichloro-1,2,2-trifluoroethane 4–10%

The dispersions were achieved by mixing for 6 to 10 hours. The viscosity of solutions was measured on a Brookfield RVT viscometer using a spindle No. 5 at 20 rpm. Viscosities of the casting solutions ranged from 0.9 to 4.5 PaS. The solutions were formed into a tape by casting onto a silicone-coated polyester film at 60° C. The thickness of the cast tapes varied between 4.1 and 10 mils. The cast sheets were blanked to the required dimensions in a blanking tool. Via holes were formed through blanked unfired sheets using a punching machine with a punch and die. If a metallization layer was desired, gold thick film paste, such as Du Pont 5717 co-fired inner conductor, Du Pont 5735 co-fired via fill, Du Pont 5715 post-fired wirebondable top paste, or Du Pont 5731 co-fired wirebondable top paste, silver thick film paste, such as Du Pont 6160 silver conductor, or a copper oxide thick film paste comprising 70–90 volume percent, based on total inorganic solids, copper oxide, 5–30 volume percent copper and an organic vehicle were screen printed onto the sheet. (All compositions designated "Du Pont" were obtained from E. I. du Pont de Nemours and Company, Inc., Wilmington, Del.). The screen printed sheets were then dried in an oven at 110° C. for 10 minutes. The printing conditions were selected so as to give a 15 micron thick layer using a 200 mesh screen. Samples were fabricated into a substrate geometry by laminating eight sheets together by means of a confined pressing die operated at 70° C. for 20 minutes under 3000 psi. The confined die prevents lateral distortion during pressing. Density inhomogeneities in the laminated samples influence the shrinkage in the sintered substrate. Therefore, the lamination process should be carried out by means of the correct die and punch with flat and parallel surfaces providing uniform pressure over the total surface, or by using a pressing die providing isostatic pressure.

For parts with noble metal instead of copper metallization, the following firing sequence was used: the unfired laminate was heated in air at a rate of 5° C./min. to 350° C., then 1° to 2° C./min. to 500° C., held for 60 min. at 500° C., then belt furnace fired, in air, at a smooth ramp rate to 930° C. with a hold time of no less than 15 min. at 930° C. to give a total (door-to-door) firing time of 100 to 120 minutes.

The parts with copper metallization were fired with the following sequence: the unfired laminate was preheated at a rate of 5° C./min. to 200° C., then heated at a rate of 1° to 2° C./min. to 525°–550° C. and held there for 1.5 to 3 hours in air. The part was then allowed to cool to room temperature. In a second stage, the copper oxide in the copper thick film paste is reduced to elemental copper. This is carried out in an atmosphere of $CO/CO_2H_2O$ (1/96/3) or $H_2/N_2$(3–4/97–96). In the $CO/CO_2H_2O$ atmosphere, the part was heated to 485° C. In the $H_2N_2$ atmosphere, the part was heated to 350° C. The part was heated at a rate of 5°–10° C./min. and maintained at the final temperature for 1.5 to 3 hours. The part was then allowed to cool to room temperature. In the third stage, the part was heated in a nitrogen atmosphere to 900° C. at a rate of 70° C./min. and then maintained at 900° C. for 15 minutes. Finally, the parts were furnace cooled to room temperature.

Unless otherwise specified, amounts in these examples are based on weight.

EXAMPLES 1–3

These examples illustrate the effect of the addition of a small amount of polycrystalline cordierite to dielectric compositions using cordierite as the amorphous crystallizable glass. The composition of the amorphous crystallizable cordierite glass used was 25.6% MgO, 20.6% $Al_2O_3$, 50.2% $SiO_2$, 2.0% $P_2O_5$, and 1.9% $B_2O_3$. The average particle size [in $\mu$m] was $d_{[10]}=6$–7, $d_{[50]}=2.4$–2.7, $d_{[90]}=0.7$–0.9. The average surface area of the particles was 8–14 $m^2/g$. The amorphous borosilicate glass composition was 71.5% $SiO_2$, 25.5% $B_2O_3$, 0.25% $Al_2O_3$, 1% $K_2O$, 1% $Li_2O$ and 0.1% zirconia and trace impurities of alkaline earth and alkali oxides. The polycrystalline cordierite was product GM31682 obtained from Schott Glaswerke, Mainz, West Germany.

Casting solutions were formulated with 51.53% by weight solids, 6.00% by weight binder/plasticizer matrix and 42.47% by weight solvent. The composition of the solids is given below. The sheets were fired without any metallization using the conditions described above. Dielectric constant, thermal coefficient of expansion and fired density were measured. Fired density is reported as a percent of the theoretical density. Theoretical density is calculated by calculating the volume fractions of the individual components, multiplying them by the respective specific gravity of the component (a physical constant of the component), and adding together the products, the sum being the theoretical density. The results are as follows.

| Example No. | 1 | 2 | 3 |
|---|---|---|---|
| | Solids Composition (% Weight) | | |
| Borosilicate Glass | 30.00 | 30.00 | 30.00 |
| Cordierite Glass | 57.00 | 56.50 | 56.00 |
| Quartz (ECA) | 13.00 | 13.00 | 13.00 |
| Polycrystalline Cordierite (CCA) | — | 0.50 | 1.00 |
| | Properties | | |
| K | 4.5 | 4.5 | 4.5 |
| TCE (ppm/°C.) | 4.1 | 3.9 | 3.7 |
| Fired Density (% Theoretical) | 95.0 | 96.0 | 91.0 |

The lower fired density in Example 3 indicates that crystallization of the cordierite glass is being initiated too early in the sintering stage. This early crystallization process gives rise to an undesirably porous sintered body. Therefore, the amount of polycrystalline cordierite should be less than 1.0% by weight, basis total solids.

EXAMPLES 4–5

The following examples illustrate the improved adhesion achieved with the compositions of the invention.

Casting solutions were formulated and fired as described for Examples 1 and 2. A surface metallization layer of DuPont 9153 copper thick film paste (E. I. du Pont de Nemours and Company, Wilmington, Del.) was screen printed onto the fired substrate and then postfired in a belt furnace using a $N_2$ atmosphere. Four parts were lightly erased and leads were soldered with 60/40 (tin/lead) solder using Alpha 611 flux obtained from Alpha Metals, Inc., Chicago, Ill. The adhesion was measured by pulling leads on a tensile test machine manufactured by Instron Corp., Canton, Mass. The results are summarized below.

| Example No. | Polycrystalline Cordierite (Wt. %) | Adhesion (N) initial | aged 100 hr |
| --- | --- | --- | --- |
| 4 | 0 | 13.3 | 10.4 |
| 5 | 0.25 | 22–26 | 20–29 |

EXAMPLES 6–7

Examples 1 and 2 can be repeated using amorphous crystallizable anorthite glass and polycrystalline anorthite instead of amorphous crystallizable cordierite glass and polycrystalline cordierite, respectively. The amorphous crystallizable anorthite glass and the polycrystalline anorthite CCA have the following composition: 19.3% CaO, 35.2% $Al_2O_3$, 41.5% $SiO_2$, 2% $B_2O_3$, and 2% $P_2O_5$.

| Example No. | 6 | 7 |
| --- | --- | --- |
| | Solids Composition (% Weight) | |
| Borosilicate Glass | 49.00 | 30.00 |
| Anorthite Glass | 49.00 | 56.85 |
| Quartz (ECA) | 2.00 | 13.00 |
| Polycrystalline Anorthite (CCA) | — | 0.15 |
| | Properties | |
| K | 5.3 | 5.3 |
| TCE (ppm/°C.) | 4.0 | 4.3 |
| Fired Density (% Theoretical) | 96.0 | 95.0 |

EXAMPLE 8

A multilayer test pattern having gold conductor lines, vias, capacitor and serpentine line patterns was constructed to measure the properties listed below. The dielectric layer of the multilayer was composed of 56.75% crystallizable cordierite glass, 30% amorphous borosilicate glass frit, 13% crystalline quartz, and 0.25% polycrystalline cordierite crystallization control additive. The cordierite glass, borosilicate glass and polycrystalline cordierite compositions of Examples 1–3 and the previously described Du Pont gold pastes were used. The following properties were measured:

| | |
| --- | --- |
| $K_{(10\ kHz\ to\ 10\ GHz)}$ | 4.8* |
| $DF_{(10\ kHz\ to\ 10\ MHz)}$ | 0.2–0.3%* |
| $TCE_{(25\ to\ 300°C.)}$ | 4.4 ppm/°C. |
| Mechanical Strength | |
| Flexural Strength | 35 kPSI |
| | 241 MPa |
| Fracture Toughness | 2.20 ± 0.1 MPa · m$^{\frac{1}{2}}$ |

*essentially flat response over frequency range

EXAMPLE 9

The high frequency characteristics of the dielectric of Example 8 was compared to the following dielectric substrates. The first substrate is a dielectric tape described in Steinberg, U.S. Pat. No. 4,654,095 and sold by E. I. du Pont de Nemours and Company, Inc. under the name Du Pont 851AT. The second dielectric substrate is a glass-epoxy rigid laminate sold by Allied Signal Corp., Danbury, Conn., under the name FR-4. The following properties were measured:

| Substrate | Ex. 8 | 851 AT | FR-4 |
| --- | --- | --- | --- |
| $K_{(1-10\ GHz)}$ | 4.9 | 7.4 | 4.5 |
| $DF_{(1-10\ GHz)}$ | 0.39% | 0.61% | 2.90% |

These results show that multilayer and microwave circuits made with crystallizable dielectric of this invention perform better at high frequencies than currently available dielectric substrates.

EXAMPLE 10

A 20-layer part with copper metallization, including conductors, vias and top metallization was made, using the dielectric composition of Example 8 and the copper thick film paste described above. Each layer of the part was about 4 mils thick, the vias were about 7 mils in diameter and the final part dimensions were 5 inches × 5 inches. The following properties were measured:

| | |
| --- | --- |
| Copper Conductivity | 2.5 mΩ/□ |
| $K_{(10\ kHz-10\ GHz)}$ | 4.8 |
| $DF_{(10\ kHz-10\ GHz)}$ | 0.2–0.3% |
| Insulation Resistance | 6 Tera Ω |
| Breakdown Voltage | 1.1 kV/mil |
| $TCE_{(20-300°C.)}$ | 4.4 ppm/°C. |
| Fired Density (≧96% TD) | 2.40 g/cm$^3$ |
| Surface Finish | 7–10 μ-in. CLA |
| Mechanical Strength | 35,000 PSI |
| Thermal Conductivity | 2–3 W/m/°K. |

EXAMPLES 11–21

The following examples illustrate how the basic components of the tapes can be varied to obtain different TCE's. Dielectric tapes composed of the crystallizable cordierite glass (CG), amorphous borosilicate glass frit, quartz expansion control additive and polycrystalline cordierite crystallization control additive of Examples 1–3 were fired as described in those examples with the following results:

| CG/Frit/ECA/CCA | % Theor. Density | $K_{(1\ MHz)}$ | $DF_{(1\ MHz)}$ % | TCE (30–300° C.) ppm/°C. |
| --- | --- | --- | --- | --- |
| 25/49.75/25/0.25 | 97 | 4.4 | 0.3 | 6.5 |
| 27/47.75/25/0.25 | 89 | porous | porous | 6.0 |
| 30/44.75/25/0.25 | 90 | porous | porous | 5.6 |
| 40/39.75/20/0.25 | 93 | 4.5 | 0.2 | 5.5 |
| 50/19.75/30/0.25 | 90 | porous | porous | 5.0 |
| 70/19.75/10/0.25 | 97 | 5.0 | 0.2 | 3.5 |
| 80/9.75/10/0.25 | 98 | 5.1 | 0.3 | 3.6 |
| 60/29.75/10/0.25 | 97 | 4.8 | 0.2 | 3.5 |
| 50/9/75/40/0.25 | 88 | porous | porous | 5.9 |
| 60/19.75/20/0.25 | 92 | 4.4 | 0.3 | 4.5 |

"porous" tapes absorb conductor paste when electrodes for K and DF measurements are made, and measured values thus become meaningless To further show that the compositions of the invention can be formulated to have various combinations of desired properties such as TCE, K, and fired density, the results of the above examples can be extrapolated over a wider compositional range, and wider property ranges. For example, TCE, K, and fired density were each extrapolated over the compositional range of 30–90 wt. % amorphous crystallizable glass in the cordierite field, 5–85 wt. % crystalline quartz and 5–65 wt. % amorphous borosilicate frit (the crystallization control additive was polycrystalline cordierite and, as explained above, does not affect the TCE, K, or fired density of the composition). The results generated from these extrapolations are represented in the graphs of FIGS. 1, 2 and 3.

FIG. 1 illustrates TCE as a function of composition. Most of the materials that will come in contact with the fired part will have a TCE in the range of 4.0–4.8.

Figure 2:
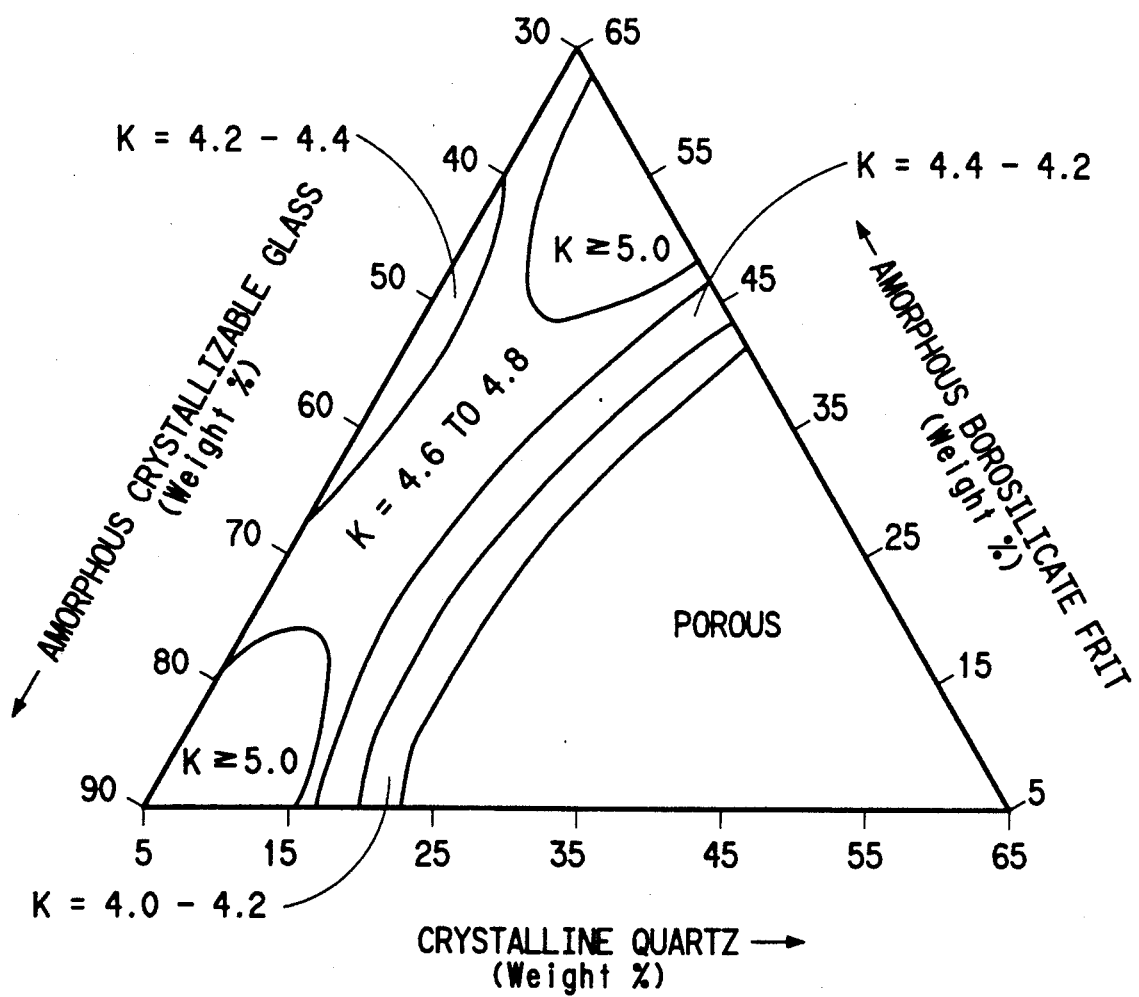
FIG. 2 is a graph of dielectric constant, K, as a function of composition for an amorphous crystallizable cordierite glass-amorphous borosilicate glass-crystalline quartz-polycrystalline cordierite system.

FIG. 2 illustrates the dielectric constant K as a function of composition. The majority of the compositions will have a K between 4.6 and 4.8, with smaller regions of $K \geq 5.0$ and $K = 4.2$ to 4.4 as indicated. The dielectric constant decreases as compositions move towards the high quartz corner. However, compositions containing more than about 30% quartz are difficult to sinter and the fired product is porous. Air which has a dielectric constant of 1 fills these pores and therefore lowers the dielectric constant of the part but, porous parts are undesirable for electronic purposes because the pores can connect and destroy the hermeticity of the part.

Figure 3:
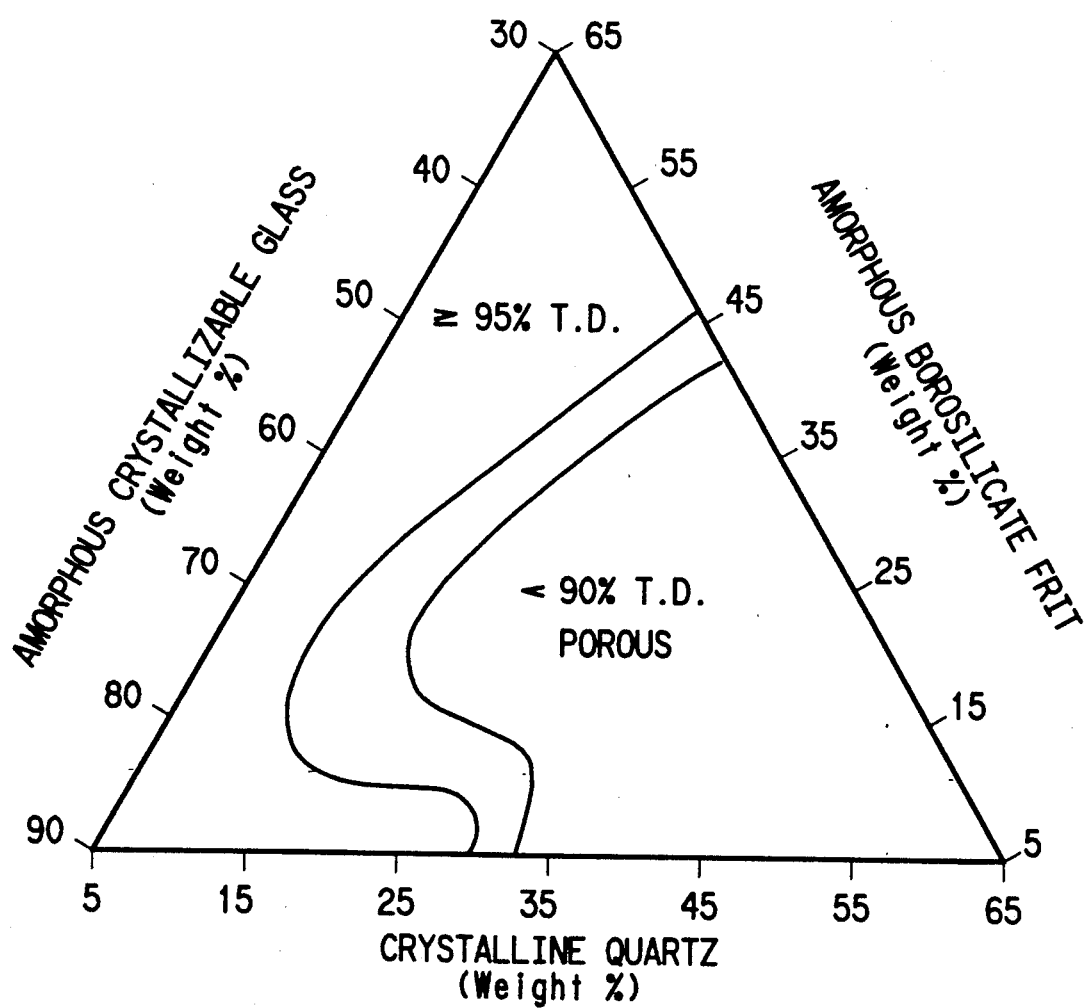
FIG. 3 is a graph of fired density, percent theoretical density, as a function of composition for an amorphous crystallizable cordierite glass-amorphous borosilicate glass-crystalline quartz-polycrystalline cordierite system.

FIG. 3 illustrates the relationship between fired density, as percent theoretical density (% TD), and composition. Porous parts ($\leq 90\%$ TD) are unsuitable for the foregoing reasons.

It is to be understood that the foregoing examples and comparative showings are presented to illustrate the invention and various changes may be made without departing from the spirit or scope of the invention.

What is claimed is:

1. A composition for making low K, low dielectric loss dielectric layers, said composition comprising an admixture of finely divided solids comprising:
   (a) 20–80% by weight, basis total solids, amorphous crystallizable glass;
   (b) 20–60% by weight, basis total solids, amorphous borosilicate glass (1) in which the weight ratio of $B_2O_3$ to $SiO_2$ is 0.22–0.55, and (2) containing, basis total borosilicate glass, 0.2–1.0% by weight $Al_2O_3$, and 1.5–4.0% by weight of a mixture of oxides of alkali metals, alkaline earth metals or mixtures thereof, at least 0.5–1.2% by weight being $Li_2O$;
   (c) 0.1 to 30% by weight, basis total solids, expansion control additive; and
   (d) 0.05 to less than 1.0% by weight crystallization control additive.

2. The composition of claim 1 wherein the crystallization control additive is polycrystalline.

3. The composition of claim 2 wherein the polycrystalline crystallization control additive and the amorphous crystallizable glass consist essentially of the same composition.

4. The composition of claim 3 wherein the amorphous crystallizable glass is selected from the group consisting of compositions of MgO, $Al_2O_3$, and $SiO_2$ that lie in the crystallization field of cordierite and compositions of CaO, $Al_2O_3$, and $SiO_2$ that lie in the crystallization field of anorthite.

5. The composition of claim 4 wherein 0.1–0.5% by weight, based on the amorphous crystallizable glass, of the crystallization control additive is present.

6. The composition of claim 5 wherein the expansion control additive is selected from the group consisting of alumina, quartz, stabilized cristobalite, aluminum phosphate, and mixtures thereof.

7. The composition of claim 6 wherein the expansion control additive is quartz or stabilized cristobalite.

8. The composition of claim 7 wherein the borosilicate glass (a) comprises on a weight basis, 71.5% $SiO_2$, 25.5% $B_2O_3$, 1% $K_2O$, 1% $Li_2O$ and 0.25% $Na_2O$.

9. A tape casting composition comprising the composition of claim 1 dispersed in a polymeric binder/plasticizer matrix in a volatile organic solvent.

10. A tape casting composition comprising the composition of claim 4 dispersed in a polymeric binder/plasticizer matrix in a volatile organic solvent.

11. A tape casting composition comprising the composition of claim 10 dispersed in a polymeric binder/plasticizer matrix in a volatile organic solvent.

12. An unfired tape formed by casting onto a flexible substrate a thin layer of the tape casting composition of claim 9.

13. An unfired tape formed by casting onto a flexible substrate a thin layer of the tape casting composition of claim 10.

14. An unfired tape formed by casting onto a flexible substrate a thin layer of the tape casting composition of claim 11.

15. A dielectric substrate comprising a fired layer of the tape of claim 12.

16. The dielectric substrate of claim 15 further comprising a ceramic base layer.

17. The dielectric substrate of claim 16 wherein the ceramic base layer comprises aluminum nitride.

18. An assemblage comprising the dielectric substrate of claim 15 and an electrically functional metallized layer.

* * * * *